(12) United States Patent
Young (10) Patent No.: US 9,590,621 B2
(45) Date of Patent: Mar. 7, 2017

(54) GATE DRIVE CIRCUIT FOR A SEMICONDUCTOR SWITCH

(71) Applicant: Eisergy Limited, Dublin (IE)

(72) Inventor: George Young, Dublin (IE)

(73) Assignee: Icergi Limited, Dublin (IE)

( * ) Notice: Subject to any disclaimer, the term of this patent is extended or adjusted under 35 U.S.C. 154(b) by 0 days.

(21) Appl. No.: 14/777,163

(22) PCT Filed: Mar. 14, 2014

(86) PCT No.: PCT/EP2014/055215
§ 371 (c)(1),
(2) Date: Sep. 15, 2015

(87) PCT Pub. No.: WO2014/140352
PCT Pub. Date: Sep. 18, 2014

(65) Prior Publication Data
US 2016/0036435 A1    Feb. 4, 2016

(30) Foreign Application Priority Data
Mar. 15, 2013 (GB) .................................. 1304723.8

(51) Int. Cl.
*H03K 17/687* (2006.01)
*H03K 17/0412* (2006.01)
*H03K 17/691* (2006.01)

(52) U.S. Cl.
CPC ....... *H03K 17/687* (2013.01); *H03K 17/0412* (2013.01); *H03K 17/691* (2013.01); *H03K 2217/009* (2013.01); *H03K 2217/0036* (2013.01)

(58) Field of Classification Search
CPC .... H03K 17/10; H03K 17/102; H03K 17/122; H03K 17/16; H03K 17/30; H03K 17/60; H03K 17/687
USPC ...... 327/108, 109, 110, 111, 112; 363/21.04, 363/21.09
See application file for complete search history.

(56) References Cited

U.S. PATENT DOCUMENTS 8,054,654 B2 * 11/2011 Kato .................... H03K 17/567
327/434

FOREIGN PATENT DOCUMENTS

DE         3230080 A1     2/1984
DE         20204558       7/2002

OTHER PUBLICATIONS

"PCT Search Report/Written Opinion for related PCT/EP2014/055215 application, mailed Aug. 12, 2014, 20 pages".

* cited by examiner

*Primary Examiner* — John Poos
(74) *Attorney, Agent, or Firm* — Charles A. Lemaire; Jonathan M. Rixen; Lemaire Patent Law Firm, P.L.L.C.

(57) ABSTRACT

The present application is directed to drive arrangement for semiconductor switches and in particular to a method of driving the gate of a switch with pulses corresponding to turn-on and turn-off commands through separate turn-on and turn-off transformers. The application provides a fail safe reset feature, a more efficient turn-on circuit and an energy recovery circuit for recovering energy from the gate upon turn-off. The application also provides a novel arrangement for assembling multiple pulse transformers on a circuit board.

20 Claims, 8 Drawing Sheets

GATE DRIVE CIRCUIT FOR A SEMICONDUCTOR SWITCH

FIELD OF THE APPLICATION

The present application is directed to drive arrangement for semiconductor switches and in particular to a method of driving the gate of a switch with pulses corresponding to turn-on and turn-off commands.

BACKGROUND

The present application is directed to isolated gate drive circuits which are employed to control the operation of semiconductor switches. Isolation is frequently desirable when controlling semiconductor switches. Examples of situations where isolation is desirable include when voltages being switched by a semiconductor switch are relatively high compared to those employed in the control circuit controlling the operation of the semiconductor switch or when a "floating" semiconductor switch is used or if drive is to be effected across an isolation boundary.

A common approach to driving the gate of a semiconductor switch, such as a MOSFET, employs a drive transformer in which a drive signal is generated and applied to the primary side winding of the drive transformer. The output from a secondary winding of the drive transformer is used to provide a turn-on voltage to the gate of the semiconductor switch. In this configuration, the width of the drive signal $T_{drive}$ substantially determines the ON time $T_{ON}$ of the semiconductor switch, i.e. the semiconductor switched is caused to be turned on at the start of $T_{drive}$ and once the $T_{drive}$ finishes the semiconductor switch starts to turns off. A disadvantage of this approach is that a relatively large transformer is required. Additionally, the transformer requires equal and opposite volt seconds for both applying the ON pulse and resetting the transformer. Indeed the need to ensure this reset condition can complicate designs. A further problem is that the use of a capacitor is generally required on both the primary and secondary sides. It will be appreciated that including such capacitors in a design generally precludes the design from implementation in silicon. It also has adverse consequences for the dynamic behaviour of the circuit under start-up and other conditions requiring rapid change of duty cycles, given that such capacitors typically need to charge to a mean voltage level depending on duty cycle.

Figure 1:
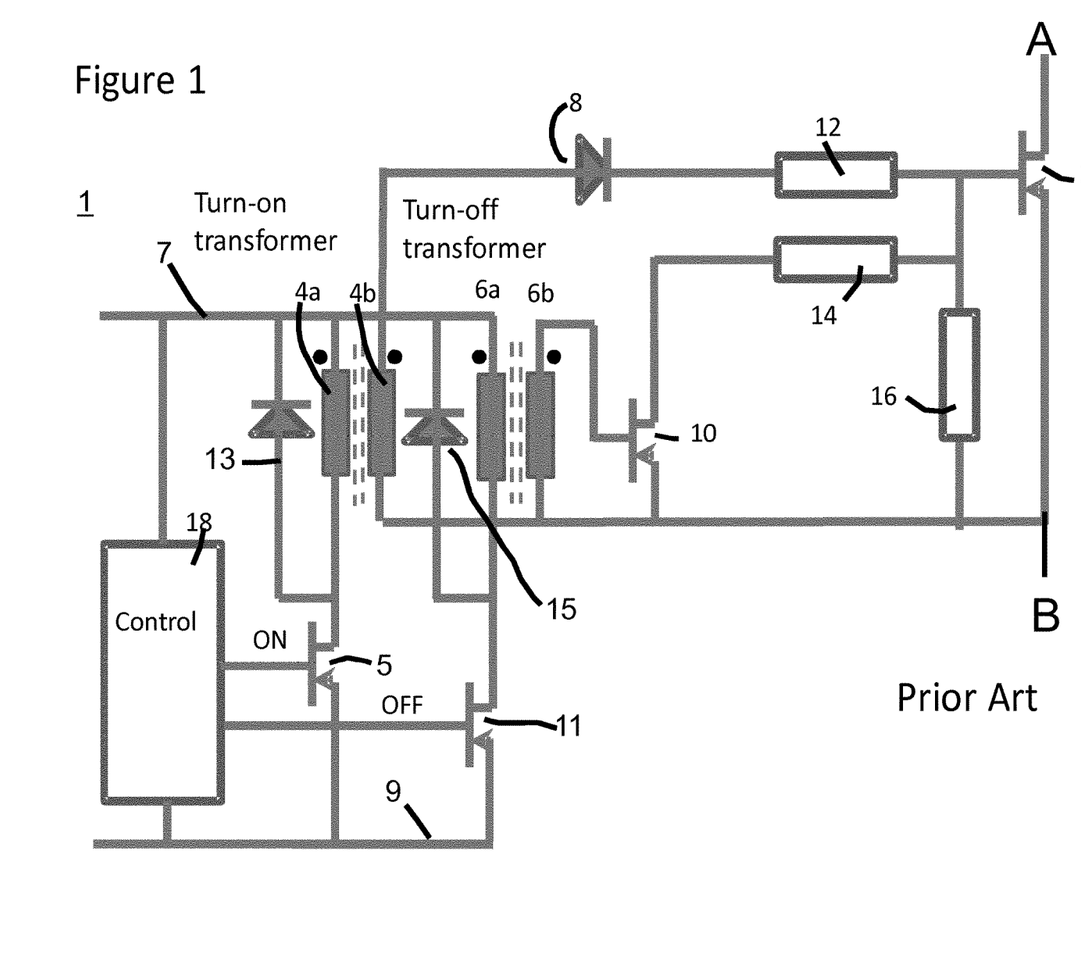
FIG. 1 represents a known circuit using a pulse transformer to turn on a voltage driven semiconductor switch.

A less common approach and the one which is employed generally in the present application is to employ a drive circuit in which a first pulse is provided to turn on the semiconductor switch through a first transformer (turn-on transformer). In contrast to the previously described approach, the duration of the pulse does not dictate the ON time of the semiconductor switch. A separate pulse is employed through a second transformer (turn-off transformer) to cause a reset circuit to turn off the semiconductor switch. As a result, the ON time of the semiconductor switch is dictated by the delay between the first and second pulses. An exemplary arrangement for such an isolated gate drive circuit is shown in FIG. 1 for the operation of a switch 2 for switchably connecting a first node (A) to a second node (B).

In this circuit 1, a first control pulse, hereinafter referred to as an 'ON' pulse, is generated by a control circuit 18 and applied to the primary windings 4a of a first pulse transformer 4 in the exemplary circuit by means of a switch 5 connecting the primary between a supply voltage 7 of the control circuit (frequently referred to as a bias rail) and a control circuit ground 9 in response to a control signal from the control circuit 18.

Typically the 'ON' pulse may have a duration of between 20 ns and 100 ns. The output from the secondary winding 4b of the first pulse transformer is provided across the gate and source of the semiconductor switch 2, which may for example be a MOSFET, IGBT or similar voltage driven semiconductor switch. For the purposes of explanation, the operation of the circuit will now be described in the context of where the semiconductor switch is a MOSFET 2. One side of the secondary winding 4b is connected directly to the source of the MOSFET. The other side of the secondary winding 4b is connected through a rectifier 8 to the gate of the MOSFET. When an ON pulse is applied to the primary winding 4a of the first pulse transformer, a corresponding pulse is presented on the secondary winding which is directed to the gate of the MOSFET through the rectifier 8 turning the MOSFET on. Because of the presence of the rectifier 8 the gate capacitance holds the pulse voltage thus maintaining the MOSFET in an ON state once the ON pulse has finished. As a result, the duration of $T_{on}$ is not dictated by the length of the ON pulse, thus allowing for a shorter duration pulse to be employed. A resistor 12 is provided in series with the rectifier 8 to limit the current. The resistance value of the resistor may be selected to slow the rise time of voltage on the gate of the MOSFET2 for EMI purposes. A rectifier (reset diode) 13 may be provided across the windings of the transformer to provide a path when the ON pulse finishes and the first switch turns off.

As the rectifier 8 effectively stops the MOSFET resetting when the ON pulse is removed, a separate reset circuit is provided to turn off the MOSFET. The reset circuit generally comprises a second pulse transformer 6. A primary winding 6a of this second pulse transformer is driven with a pulse, hereinafter referred to as an 'OFF' pulse from the control circuit 18, which in the case of the exemplary circuit is by means of a second switch 11 connecting the primary winding of the second transformer between a supply voltage 7 of the control circuit (frequently referred to as a bias rail) and a control circuit ground 9 in response to a control signal from the control circuit 18. A rectifier (reset diode) 15 may be provided across the windings of the transformer to provide a path when the OFF pulse finishes and the second switch 11 turns off. Usage of reset diodes 13, 15 limits voltage stress on switches 5 and 11, and usage of these diodes with the corresponding low reset voltage is feasible as the duty cycles are very low. The low values of reset voltage are also conducive to implementation of the semiconductor drive elements in integrated-circuit form.

The 'OFF' pulse has a comparable duration to the 'ON' pulse. The secondary winding of the second pulse transformer provides a pulse to the gate of a second semiconductor switch 10, which may be a small MOSFET. This second switch is connected across the gate and source of the first MOSFET 2. The 'OFF' pulse thus turns on the second switch 10 which provides a path for the gate capacitance of the first MOSFET to discharge thus turning off the first MOSFET 2. A resistor 14 may be provided in series with the second switch 10 to limit the speed of turn-off for EMI or other purposes. A disadvantage of this configuration is that there is a high impedance condition in either state between switching instants, which can render the device susceptible to conditions of spurious turn-on when the device has been commanded to be "off". This can be addressed in part by fitting a further resistor 16 across the gate and source of the MOSFET 2. However, whilst a low value of resistance is desirable for noise immunity using a low value of resistance for resistor 16 causes material losses when the gate of the MOSFET 2 is driven high.

One problem with the arrangement is that significant energy is required to cause the semiconductor switch to turn ON, with most of this energy wasted in the resistor 12. Eliminating the resistor does not solve the problem as the energy wastage is simply transferred to the rectifier 8 and problems of excessive current and EMI are introduced. Whilst these losses may be acceptable in low frequency switching circuits, the losses increase directly with frequency and as a result, the use of pulse transformer circuits in this manner is less desirable at higher frequencies because of poor efficiency and the requirement to dissipate heat generated in the drive and reset circuits.

SUMMARY

The present application provides generally for the use of dual transformers for operating a semiconductor switch with a first transformer being used to switch on a semiconductor switch and a second transformer or other signal transfer device being used to turn off the semiconductor switch. The use of two transformers offers increased robustness and reliable switching.

The Present Application Provides an Arrangement that Increases the Efficiency of Previous Designs.

A problem in employing a circuit requiring two pulses with one to turn on a switch and a second to turn off a switch is that a dangerous situation can arise if for some reason no 'OFF' pulse is received. The present application provides solutions to this identified problem, the problems identified above and others.

More particularly, the present application provides a 'fail safe' mechanism for an isolated gate drive circuit controlling a semiconductor switch for ensuring the semiconductor switch being controlled is turned 'off' in the event that no reset pulse is received. The 'fail safe' mechanism is triggered by the arrival of an 'ON' pulse turning on the semiconductor switch and automatically turns 'OFF' the semiconductor switch in the event that no 'OFF' pulse is received.

Thus an isolated gate drive circuit for controlling the operation of a first semiconductor switch is provided in accordance with the appended claims. The isolated gate drive circuit comprises: a first transformer for transferring a first pulse from a primary side to a secondary side; a first rectifier for providing the transferred pulse to the gate of the first semiconductor switch to effect the semiconductor switch to be turned on; and a reset circuit being triggered by the arrival of the first pulse and being configured to turn off the semiconductor switch within a predefined interval after the arrival of the first pulse. Further embodiments of this isolated gate drive circuit are set out in the appended claims.

The present application also provides a novel isolated gate drive circuit for controlling the operation of a semiconductor switch, the details of which are set out in the appended claims. The gate drive circuit employs LC resonance to cause the semiconductor to switch.

In particular, an isolated gate drive circuit for turning on a semiconductor switch is provided in accordance with the appended claims. The isolated gate drive circuit uses a pulse and comprises: a transformer having a primary side with a primary winding for receiving the pulse and a secondary side, the secondary side comprising a secondary path comprising a secondary winding of the transformer, a rectifier and the gate capacitance of the semiconductor switch, wherein the series inductance capacitance (LC) resonance of the secondary path is employed to provide a gate voltage pulse of suitable rise time and amplitude and to cause the semiconductor switch to switch. Further embodiments of this isolated gate drive circuit are set out in the appended claims.

Using this approach, the requirement for a series resistor after the diode is eliminated, a lower turns ratio can be used and a smaller transformer may be employed, thereby significantly reducing losses.

The present application further provides an energy recovery circuit for use in an isolated gate drive circuit controlling the operation of a semiconductor switch. The energy recovery circuit recovers energy from the gate capacitance when a pulse is received to turn off the semiconductor switch.

Thus, an isolated gate drive circuit for switching a semiconductor switch is provided in accordance with the appended claims, comprising: a first transformer for providing a first pulse through a rectifier to turn on the semiconductor switch, a reset circuit operable to turn off the semiconductor switch in response to a second pulse, the reset circuit comprises a second switch for connecting the gate of the semiconductor switch to a transformer winding to recover energy from the gate. Further embodiments of this isolated gate drive circuit are set out in the appended claims.

A reset circuit for an isolated gate drive circuit is also provided in accordance with the appended claims. The reset circuit controls the operation of a first semiconductor switch in an isolated gate drive circuit comprising a first transformer for transferring a first pulse from a primary side of the first transformer to a secondary side of the first transformer to provide a voltage through a first rectifier to the gate of the first semiconductor switch to cause the semiconductor switch to be turned on. The reset circuit comprises a monostable circuit having a stable state and a metastable state, wherein the monostable circuit is configured to be triggered into the metastable state by the arrival of the first pulse, the monostable circuit comprising a second semiconductor switch configured to clamp the gate voltage of the first semiconductor switch when the monostable circuit is the stable state. Further embodiments of this reset circuit are set out in the appended claims.

In another aspect, an arrangement is provided of at least two pulse transformers which are commonly assembled on a circuit board with windings provided by conductive tracks on the circuit board. The magnetic cores of the pulse transformers are provided as top and bottom sections, one of which is provided as a common structure between the pulse transformers at least during assembly. They may after assembly on the circuit board be separated.

It will be understood that these solutions and any embodiments thereof may be combined together in different combinations as required.

DESCRIPTION OF DRAWINGS

The application will now be described with reference to the accompanying drawings in which.

DETAILED DESCRIPTION OF DRAWINGS

Figure 2:
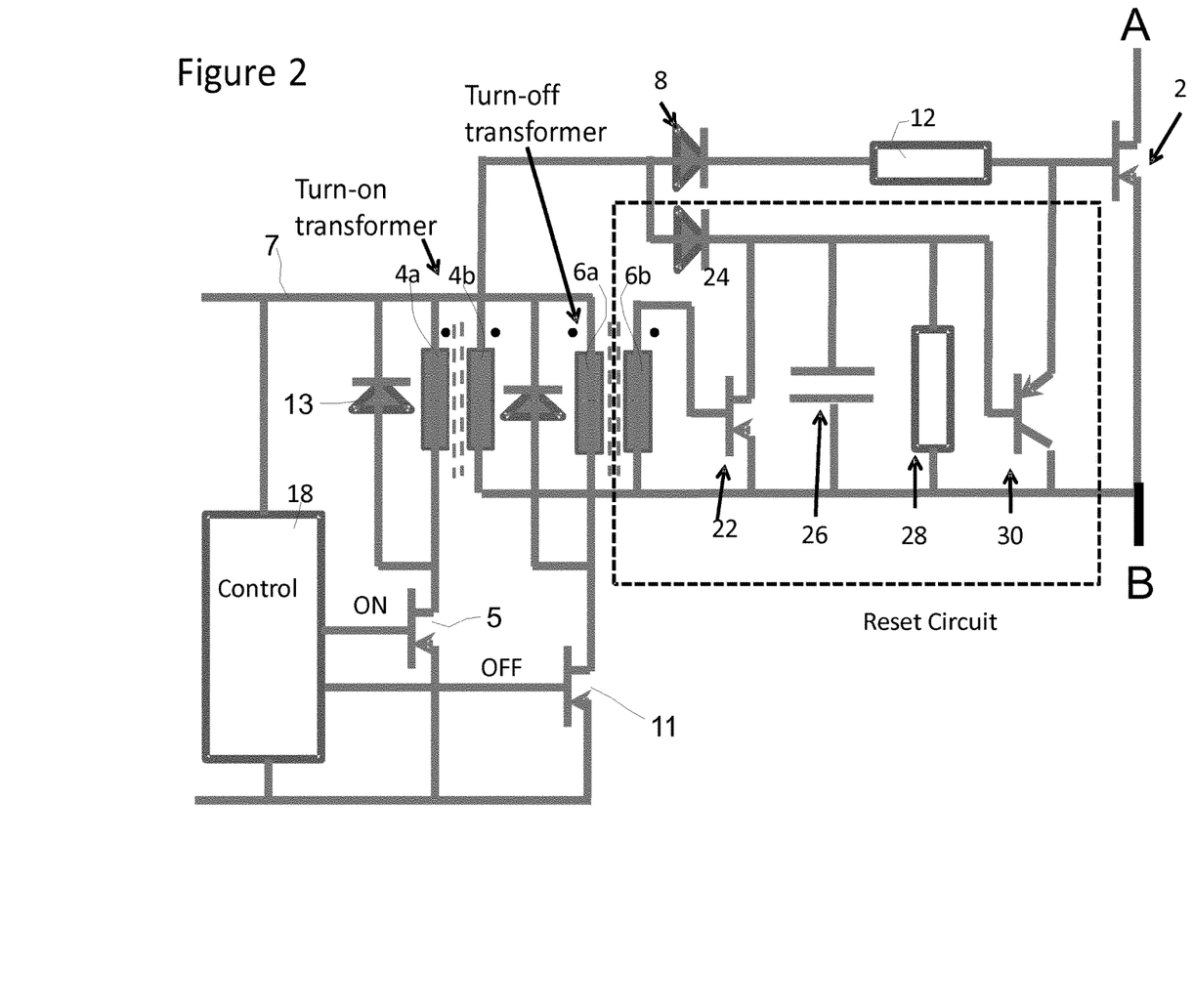
FIG. 2 is an isolated gate drive circuit for a semiconductor switch according to a first aspect of the present application incorporating a fail safe reset feature.

A first arrangement provides a new isolated gate drive circuit as shown in FIG. 2 for switching a semiconductor switch 2. The isolated gate drive circuit has a number of common features with the circuit of FIG. 1 and accordingly reference numerals employed are shared with FIG. 1 where appropriate.

The drive circuit of FIG. 2 for turning "ON" the semiconductor switch may be as described previously with respect to FIG. 1. More particularly, a control circuit 18 is configured to provide a pulse to turn 'ON' a first switch 5 which in turn connects the primary winding 4a of a first transformer 4 between a supply voltage ($V_{bias}$) and ground (0V) causes the primary winding of the first transformer to energize.

The output from the secondary winding 4b of the first transformer is provided through a rectifier 8 and optionally series resistor 12 to the gate of the MOSFET 2. Thus the application of an 'ON' pulse to the primary winding is transferred across the isolation barrier of the transformer and effects a turning on the MOSFET 2.

The arrangement of FIG. 2 employs a novel reset circuit for resetting MOSFET 2. In particular, a reset circuit is provided which is configured to turn off the MOSFET 2 within a predefined interval after the arrival of the "ON" pulse. This provides a fail safe mechanism which ensures the reset circuit operates. The predefined interval is suitably greater than the interval between "ON" pulses (i.e. the switching period). The reset circuit may employ a timer triggered to begin upon the arrival of the "ON" pulse and expire after a predefined interval. The reset circuit is suitably configured to turn off the MOSFET 2 when the timer expires. This will now be explained in greater detail with reference to an exemplary circuit in which a monostable is employed to effect the timer. The monostable has a stable state in which the gate voltage of the MOSFET is clamped and a metastable state in which the gate voltage of the MOSFET is not clamped. The monostable is triggered into the metastable state by the arrival of an "ON" pulse and resets to the stable state after a predefined time interval. The monostable may also reset in response to the arrival of an "OFF" pulse.

Thus with reference to the exemplary implementation of FIG. 2, the monostable comprises a normally closed switch 30 connected across the gate and source of the MOSFET so as to clamp the gate voltage of the MOSFET. The normally closed switch 30 may be a PNP transistor. The transistor is configured to generally clamp the gate and source of the MOSFET together at a relatively low voltage, i.e. below which the MOSFET can turn on. To allow the MOSFET to be turned on by an arriving 'ON' pulse, the normally closed switch 30 is opened. This may be implemented, as shown, by providing an output from the secondary winding through a second rectifier 24 to operate the clamping transistor when an 'ON' pulse arrives. Thus the 'ON' pulse causes the clamping transistor to switch off. As the clamping transistor is switched off, the MOSFET may be turned on by the arriving 'ON' pulse.

In the exemplary arrangement shown the reset circuit comprises a parallel Resistor 28-Capacitor 26 combination. The RC combination ensures that the clamping transistor turns back on (reset of monostable) within a predefined time, which as will be appreciated by those skilled in the art is defined by the RC time constant. Thus the reset circuit always resets within a predefined time, irrespective of whether or not a reset 'OFF' pulse is received. This ensures fail safe operation of the reset circuit to ensure turn off of the MOSFET. It will be appreciated that the reset circuit thus operates as a monostable having a stable state in which the switch 30 is closed causing the gate voltage of the MOSFET 2 to be clamped and a metastable state in which the switch 30 is open allowing the MOSFET to be turned on.

This fail safe reset circuit may operate in parallel to a conventional reset circuit for example as previously described with respect to FIG. 1 which is responsive to the arrival of an 'OFF' pulse. In an alternative configuration, as shown, in FIG. 2, the fail safe functionality may be integrated with a reset circuit responsive to the arrival of an 'OFF' pulse. Such an arrangement is provided in FIG. 2, in which a second transformer 6 is employed to transfer a second pulse ("OFF" pulse) from the primary side to the secondary side. The secondary winding of the second transformer is connected to a further semiconductor switch 22 which is positioned in parallel with the capacitor. An arriving 'OFF' pulse switches on the semiconductor switch 22 providing a low resistance path for the capacitor 22 to discharge. This in turn causes the clamping transistor to turn on (reset of monostable) thus turning off the MOSFET. It will be appreciated that the second transformer is not required to transfer power in the same manner as the first transformer which needs to charge the gate capacitor, accordingly the second transformer may be any suitable isolated signal transfer device and is not limited to being a transformer. Thus for example, the second transformer may be replaced by an optocoupler.

The value of capacitor 26 is selected such that the time constant of the resistor 28 capacitor 26 combination is a small multiple, for example less than 3 times the typical switching period, but not such as to clamp materially the voltage on the gate of MOSFET 2 prior to termination of the normal ON-state time of this device. It will be recognised that the dissipation in switch 2 will be significant during the "emergency" turn-off, as this will involve a relatively slow transition as associated with the RC time constant through the gate voltage range associated with linear operation. Given that this is a non-repetitive condition and that such a period of linear operation can be less than several microseconds when the design process is associated with drives for converters operating at high frequencies, ensuring that the device remains within its safe operating area is usually not an arduous design requirement.

This prevents the clamp transistor from pulling the gate of the MOSFET low as soon as the gate drive turn-on pulse is removed. The usage of resistor 28 and capacitor 26 at the same time ensures fail-safe operation, if no pulse is applied for some time, to turn the MOSFET off.

Thus the exemplary arrangement of FIG. 2 provides a fail safe reset mechanism. This mechanism is also employed in the exemplary arrangements of FIGS. 3, 4 and 5.

Figure 3A:
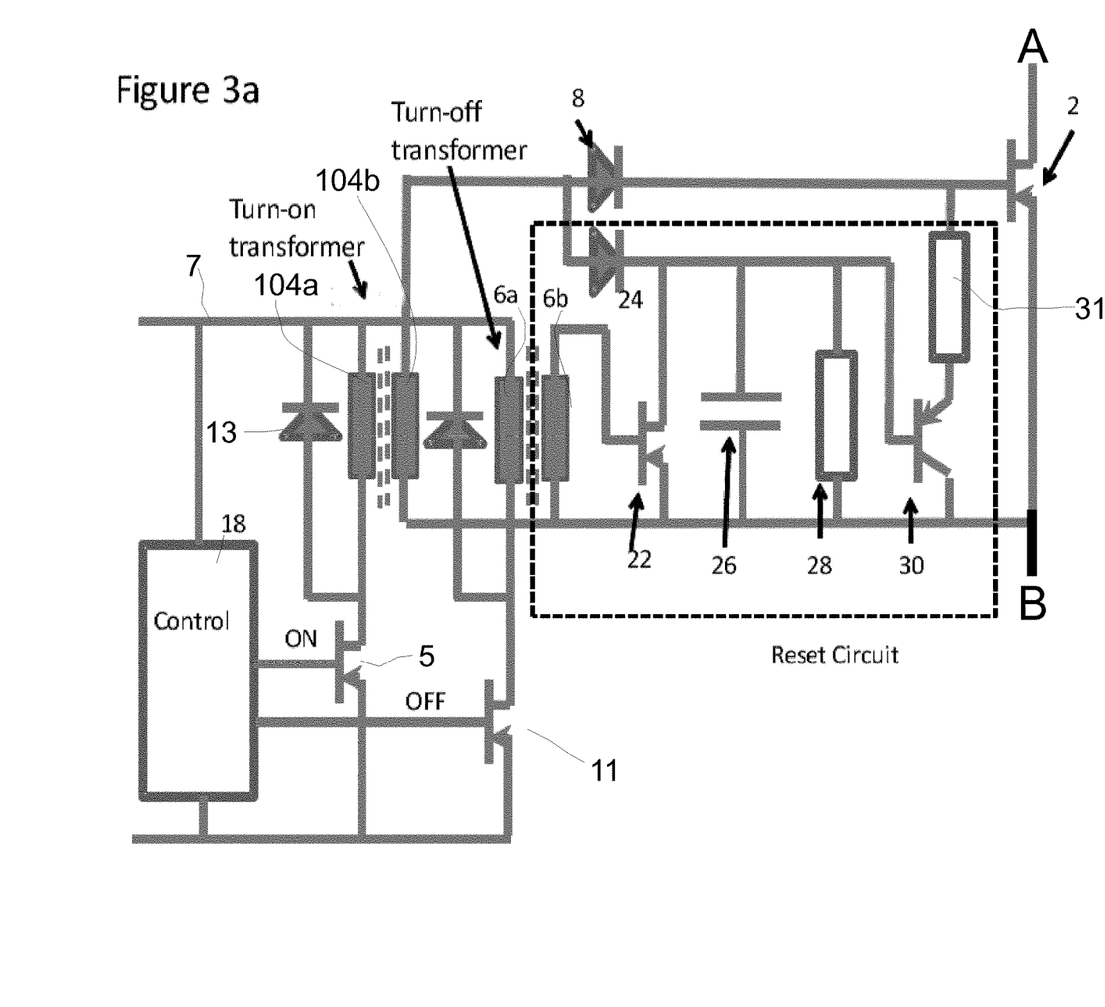
FIG. 3A is an isolated gate drive circuit for a semiconductor switch using resonance in the gate drive circuit to assist turning on the semiconductor switch.

FIG. 3 superficially appears to provide the same isolated gate drive circuit as FIG. 2 with the series resistor 12 removed. However this is not the case as the circuit of FIG. 3 requires a primary side "ON" pulse with a lower voltage than that of FIG. 2 and uses less energy than that of FIG. 2. This will now be explained.

In particular, in the arrangement of FIG. 3, there is a path on the secondary side comprising the secondary winding 104b of the transformer, a rectifier 8 and the gate capacitance of the semiconductor switch 2.

The inductance in the secondary side path driving the gate of the switch 2 is chosen so that the inductance in combination with the gate capacitance of the switch has a resonant period (inverse of resonant frequency) which is in the region of double the duration of the "ON" pulse, or more specifically That $T_{on}$ is approximately $\pi\sqrt{(LC)}$ where L is the inductance of the secondary path and C is the gate capacitance value of the switch.

The capacitance of the gate is dictated by the particular switch selected, which in turn is generally dictated by the switching requirements for the circuit in which the switch is employed the value of capacitance may generally be viewed as being predetermined or at least predetermined within a limited range. Accordingly, to ensure that a desired resonant period is provided, a circuit designer may design the secondary path inductance to match the switch selected to achieve a particular resonant period. It is to be observed that in a conventional circuit it is generally considered desirable to limit the inductance value in the secondary path to avoid ringing. In contrast, in the arrangement of FIG. 3 an increase in the inductance value is generally required. In one variation, this may be achieved by designing the transformer 104 to have significant leakage inductance. It may also be achieved by including a discrete inductor in series with the windings or indeed a combination of the two.

Figure 3B:
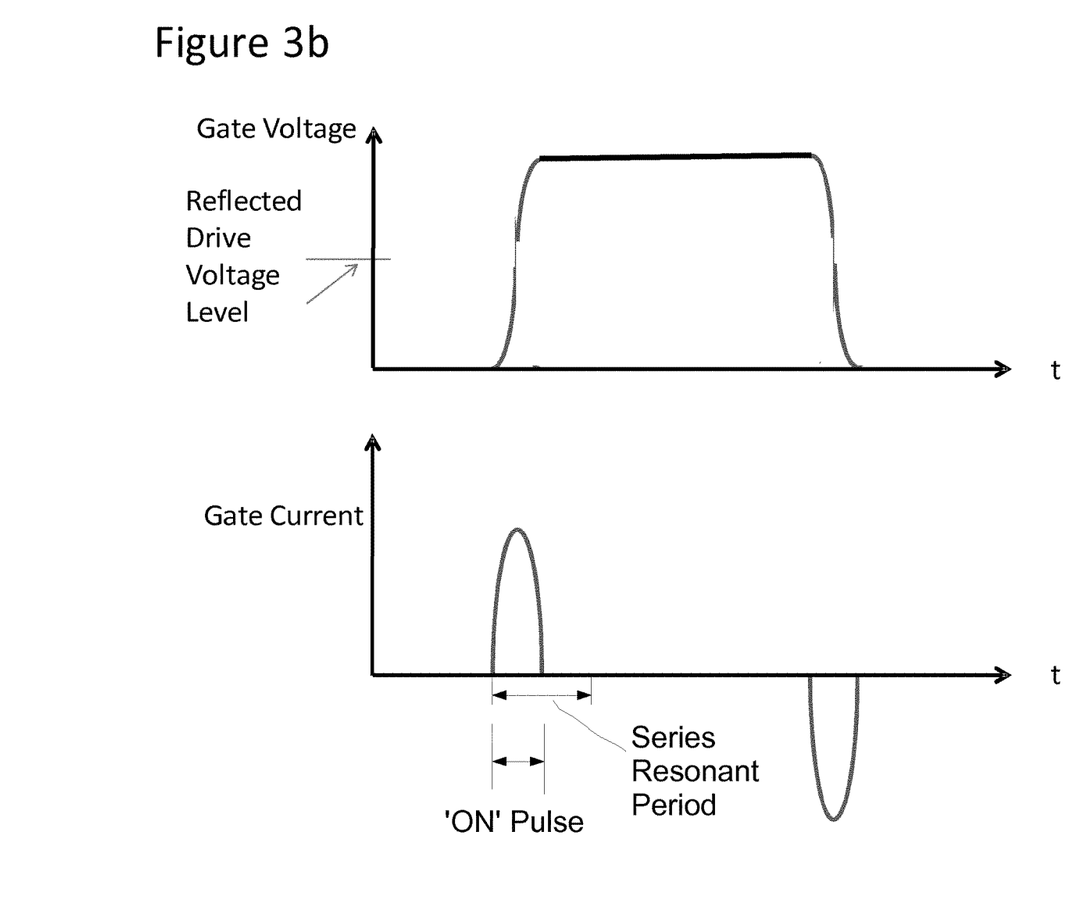
FIG. 3B illustrates exemplary waveforms from the circuit of FIG. 3A.

The effect of matching the inductor and capacitor to obtain a desired resonant frequency will now be discussed with reference to the timing waveforms of FIG. 3b.

In particular, as an 'ON' pulse is applied to the primary and its voltage is reflected from the primary windings across to the secondary windings by the turns ratio, the secondary current starts to increase along with the gate voltage. Whereas normally, the gate voltage would stop at the level of the reflected 'ON' pulse or just below it taking into account the rectifier 8 drop at which point the rectifier 8 would turn off, in the arrangement of FIG. 3, the resonant LC circuit causes the gate voltage to increase further, up to approximately twice the reflected 'ON' pulse voltage until the current drops to zero.

Thus the circuit of FIG. 3, gives a resonant drive, charging the capacitance of the power MOSFET (assuming this is linear) to approximately twice the open-circuit voltage as would be present across the secondary winding. As a result, this approach allows also for a reduction in the turns count of the transformer 104. At the same time, since the current is limited by the LC resonance, there is no need for the resistor 12 present in FIGS. 1 and 2. The control circuit providing the 'ON' pulse may be configured to provide an 'ON' pulse with a pulse width that equates to approximately half the LC resonant period so as to reduce losses. In this respect, approximately may be taken to mean within 30%, i.e. between 0.35 and 0.65 times the LC resonant period. It will be appreciated that a lower turns ratio transformer or a lower primary side pulse voltage or a combination of the two is required to turn on the switch compared to prior art implementations. Additionally, the losses are significantly less, since there are lower resistive losses owing the potential elimination of resistor 12. In an ideal circuit, losses are reduced by 50% and thus even accounting for non-idealities the potential energy saving is significant.

It may readily be determined whether a circuit is employing the principle outlined above since if it is the voltage of the pulse generated on the primary side times the turns ratio of the transformer is generally less than the gate voltage required to completely turn on the semiconductor switch, subject to nonlinearities in the effective gate capacitance of switch 2. It will be appreciated that the control circuit on the primary side may use a lower voltage 'ON' pulse Whilst the arrangement of FIG. 3 provides for significantly reduced power consumption over the prior art, energy is still lost when the gate capacitance is discharged by the reset circuit to turn off the switch 2.

Figure 4:
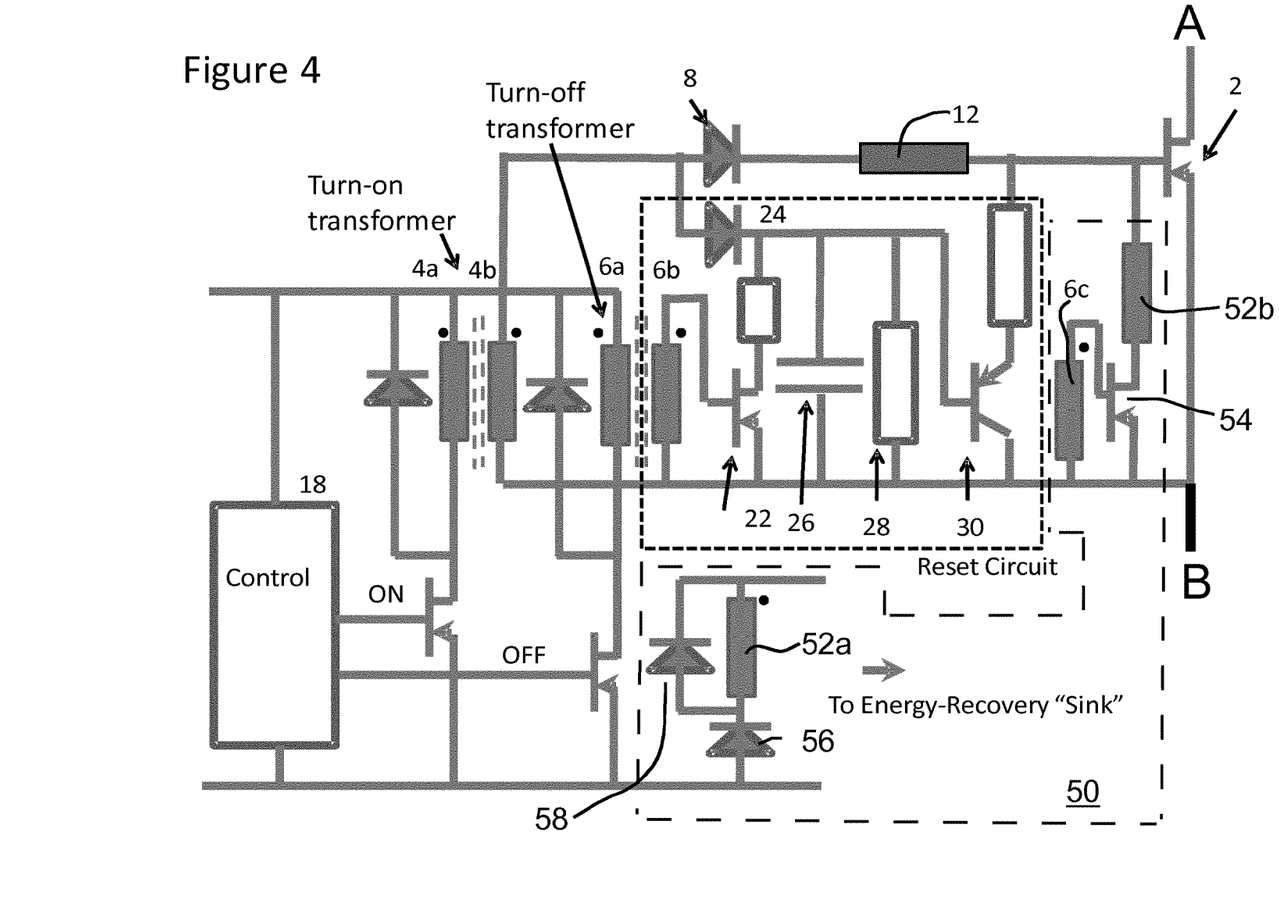
FIG. 4 illustrates an isolated gate drive circuit with an energy recovery circuit for recovering energy from the gate.

FIG. 4 provides for an energy recovery circuit which recovers some of this energy when turning off the switch. FIG. 4 provides an isolated gate drive circuit which transfers an 'ON' pulse generated on the primary side of a transformer to a secondary side to turn on a switch on the secondary side. As the energy recovery aspect presupposes the switch 2 has been turned on, it will be appreciated that any of the arrangements previously described for turning 'ON' the switch 2 using a pulse may be employed. Whilst the previously discussed "fail safe" reset circuit of FIG. 2 is presented in FIG. 4, it will be appreciated from the discussion which follows that other reset circuits may be employed, including for example that disclosed in FIG. 1. FIG. 4 provides an energy recovery circuit 50. This circuit is responsive to the 'OFF' pulse previously described. In certain configurations, there may be two 'OFF' pulses, with a first triggering the energy recovery circuit and a second triggering the reset circuit with a time delay between them to maximise the energy recovered. The energy recovery circuit provides an energy recovery transformer having a winding 52b switchably connected by a switch 54 across the gate capacitor of the switch 2, i.e. switchably connected across the gate and source of the MOSFET 2.

The switch 54 is responsive to the 'OFF' pulse. Accordingly, when an 'OFF' pulse is received, the winding 52b is connected across the gate capacitor allowing the capacitor to discharge through the winding. A further winding 52a on the energy recovery transformer, which may for example be on the primary side comprising the control circuit 18, recovers a part of this energy. This energy may for example be directed to the primary side bias supply. A rectifier 56 is provided in series with the further winding 52a to ensure the correct operation of the energy recovery circuit. A reset rectifier 58 may be provided in parallel with the further winding. The switch 54 may be operated by any suitable isolated signal transfer device such as for example an optocoupler. In the exemplary arrangement shown, the switch is operated by an additional secondary winding provided on the turn-off transformer transferring the 'OFF' pulse to the reset circuit. In this respect, a delay may be included in the reset circuit to delay the operation of the reset circuit so that energy recovery is maximised. In the exemplary circuit shown, this delay is implemented by including a resistor 60 in the path of the reset switch 22 so as to slow the discharge of the capacitor 26 through switch 22. Although, as explained above, this may also be effected by using different 'OFF' pulses for the energy recovery circuits and reset circuits with a suitable delay between them.

Figure 5:
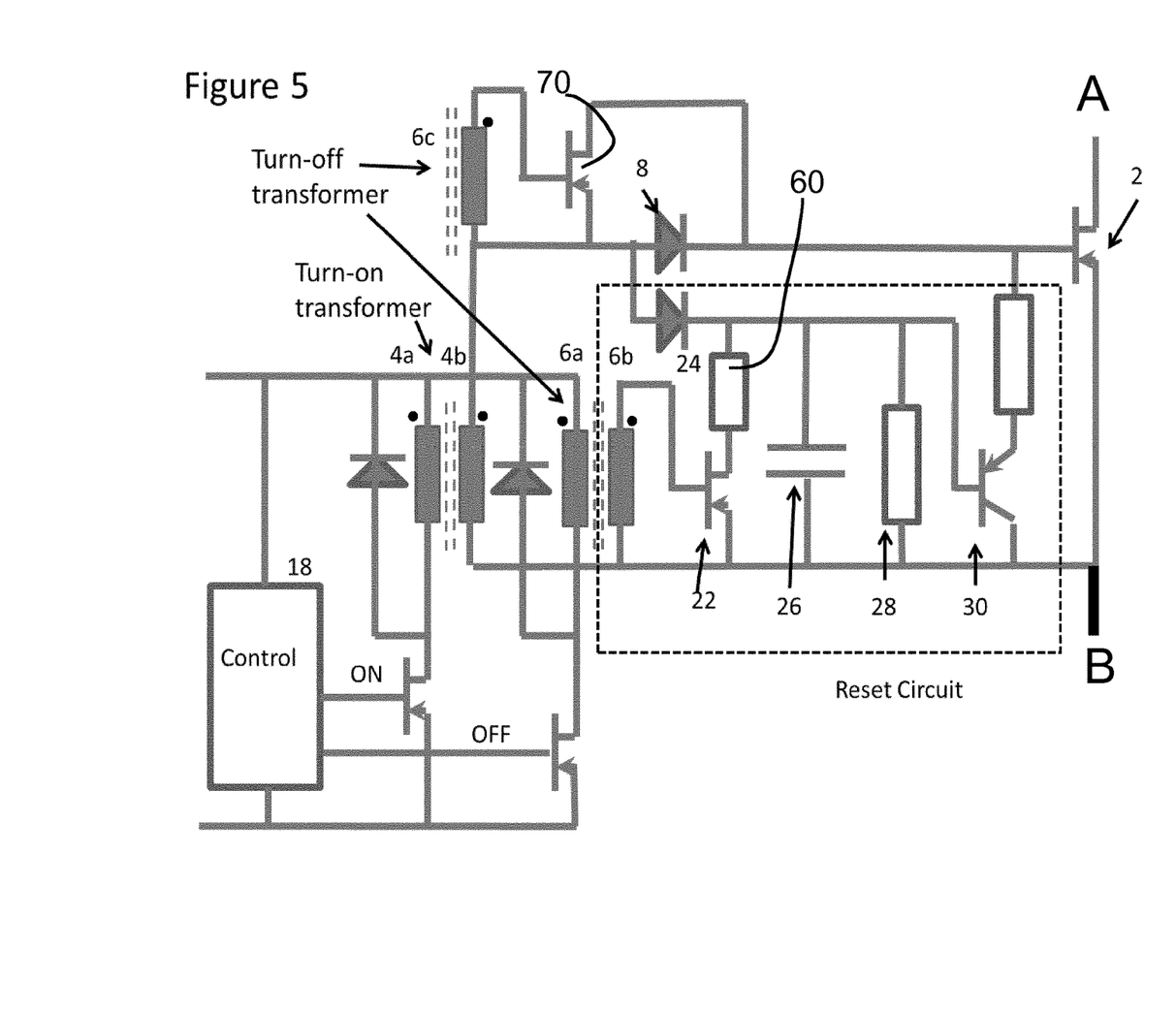
FIG. 5 illustrates an isolated gate drive circuit with an alternative energy recovery circuit.

FIG. 5 illustrates a further arrangement which combines the functionality of the energy recovery transformer and Turn-On transformer for delivering the 'ON' pulse to the switch 2. In this arrangement, a switch 70 is provided in parallel with the rectifier 8 employed to connect the secondary winding of the turn-on transformer to the gate of the switch. The switch 70 is operated by the turn 'OFF' pulse through a suitable isolated signal transfer device, which in the exemplary circuit, is a secondary winding of a turn-off transformer, which is also used to activate the reset circuit through a further secondary winding of the turn off transformer. Thus, when an 'OFF' pulse is received the switch 70 connects the gate of the MOSFET 2 across the secondary winding of the turn-on transformer allowing for energy to flow back to the primary side, thus allowing for the recovery of energy from the gate. To improve the effectiveness of the energy recovery process, the secondary winding of the Turn-On transformer may be a tapped winding. In this configuration, the switch 70 may be employed to connect the gate to the tap of the winding rather than the full winding so as to provide a higher voltage on the primary side to assist in energy recovery.

It will be appreciated that several modifications are possible, for example, switch 70 and rectifier 8 may be combined, such that the body diode of switch 70 is used as rectifier 8. Equally, it will be appreciated that whilst the term rectifier may generally be taken to refer to diodes, it also includes other rectifying devices which may for example be active switched devices rather than passive.

Moreover, it will be appreciate that an advantage of the embodiments described is that default to a state in which the switch being controlled is OFF and at the same time present a low impedance at the gate which prevents accidental turning on of the switch by noise or parasitic coupling.

The isolated gate drive circuits described herein may be employed to operate any voltage driven switch and accordingly whilst the description may refer to the switch being a MOSFET, the application is not so limited. For example, the switch may be a IGBT. The switch in turn may be employed in a variety of switching applications including switching power supplies and motor drives. Exemplary, switching power supplies include for example, switched power factor correction circuits, switched "LLC" resonant circuits, flyback converters and synchronous rectifiers.

It will be appreciated that whilst several different embodiments have been described herein, the features of each may be advantageously combined together in a variety of forms to achieve advantage and that variations are possible. Thus for example whilst the foregoing description has been described in the context of using the 'ON' pulse to set the monostable/reset circuit, equally the 'OFF' pulse may be employed by suitable arrangement of the circuit. In both cases, this ensures there is a fail safe reset mechanism which operates to ensure the switch is turned off. Equally whilst the 'OFF' pulse and any associated reset mechanism has been described with reference to ensure that a single switch is turned off, the same arrangement may be used in situations where multiple switches are required to be switched off. This is particularly useful in situations where the two or more switches share a common ground, for example in situations where the switches are employed as synchronous rectifiers.

Whilst the foregoing description has been described in the context of switching a single semiconductor switch, the second transformer which is employed to transmit the off-pulse may have a plurality of secondary windings. In this way, the second transformer may operate to produce a "common off pulse" where each of the secondary windings provides a reset pulse, where each reset pulse may be used to drive a plurality of reset circuits for different switches, thus reducing the component count. This approach assists in noise immunity and is, for example, of benefit in driving bridge-type converters.

The use of a "common off pulse" can also be of value when converters are synchronised, where having a common turn-off "instant" may simplify current measurement and allow this to be undertaken immediately prior to the switching transition, thus avoiding noise. A further advantage of this approach is that the 'off' pulse may be used as a heartbeat pulse for other components or circuits. Thus, whilst the 'off' pulse may be provided to one or more pulse transformers to turn off one or more switches, it may also be provided to one or more other pulse transformers for other functions including to provide power to small circuits. The advantage of using the common 'off' pulse for this is that the control of the small circuits may be readily achieved without separate components and that power may be distributed in an efficient manner. It also means that circuits may effectively be disabled (by providing no power, i.e. off pulse) during periods of inactivity (e.g. in burst mode applications as described below). Thus a single controller may provide an 'off' pulse to drive one or more pulse transformers to turn off a semiconductor switch as previously described and the same 'off' pulse may be provided to other pulse transformers to provide power or control signals or both to other circuitry. An additional advantage of this approach is that in contrast to using 'ON' pulses to provide power, the 'OFF' pulses may provide power to enable circuits without having to switch on the power switches of the power converter in which the circuits are employed. Thus, the 'OFF' pulses may commence before the 'ON' pulses to switch on the other circuits prior to operation of the power switches.

A further advantage of the circuits and methods described herein is that they are suitable for burst mode applications since there is no charging required for any control circuits on the secondary side. In contrast, certain prior art approaches require an initializing phase before reliable switching commences. The present application has no such delays and the semiconductor switch is always turned on by the arrival of an on-pulse through a first transformer and always turned off by the arrival of an off-pulse through the second transformer.

Figure 6:
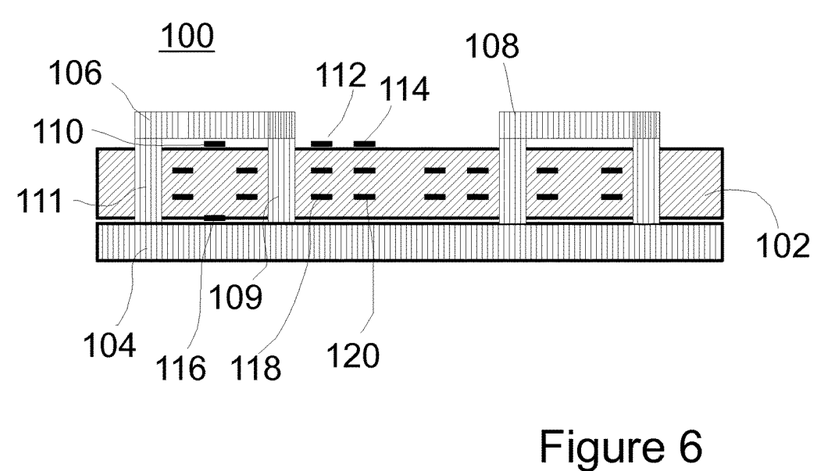
FIG. 6 illustrates a transformer assembly according to a further aspect of the present application.
Figure 7:
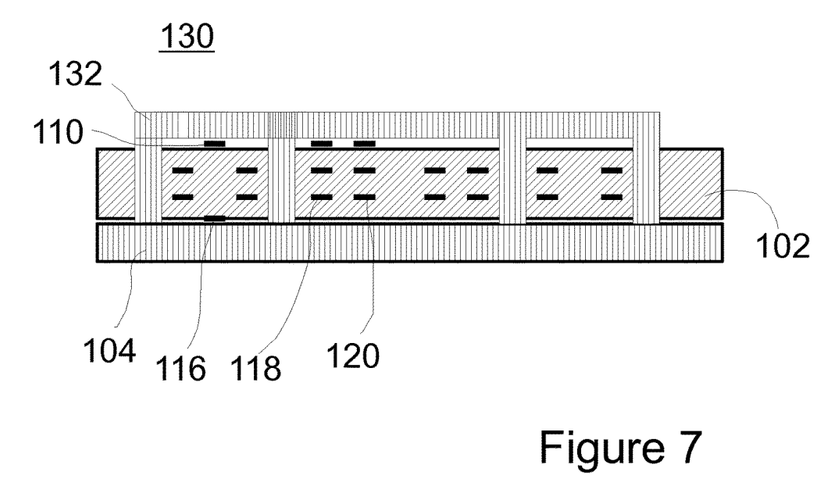
FIG. 7 illustrates an alternative assembly to the arrangement of FIG. 7.
Figure 8:
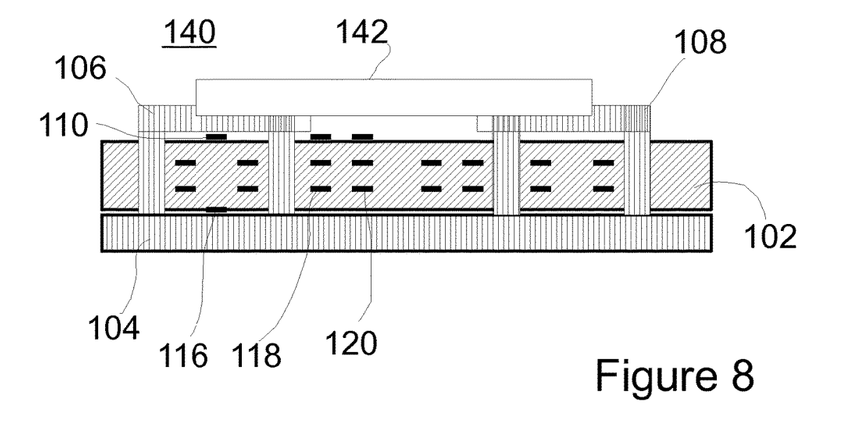
FIG. 8 illustrates a further alternative assembly to the arrangement of FIG. 6.
Figure 9:
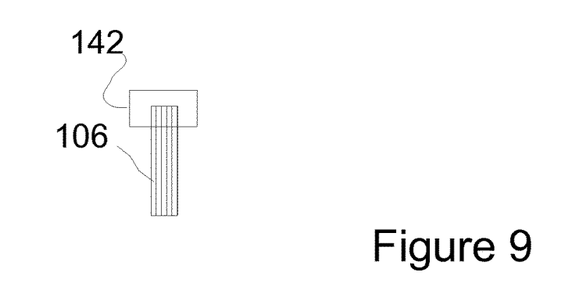
FIG. 9 is a cross sectional view of a part employed in the assembly of FIG. 8.
Figure 10:
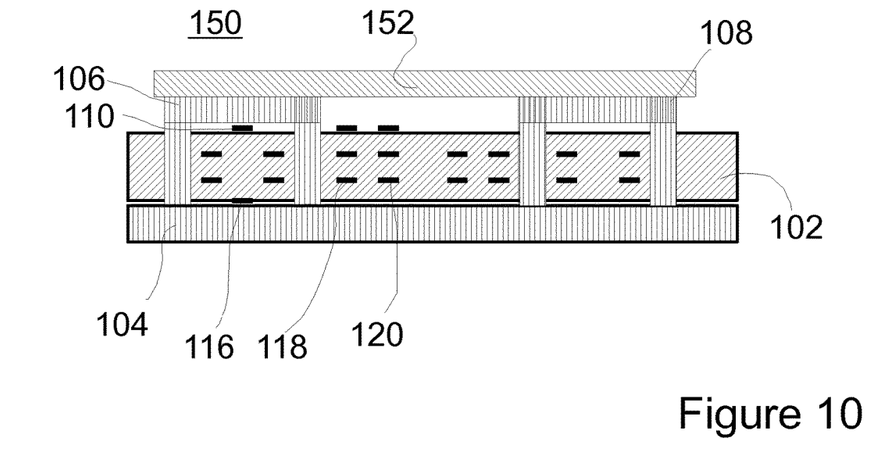
FIG. 10 illustrates another alternative assembly to the arrangement of FIG. 6.

A further advantage is that the approach when implemented has nominally zero no-load power. This aspect, coupled with immediate response when driven, commends it to usage in burst-mode operation. The approach also affords the use of extremely small transformers, whilst still transferring bias power directly. Thus for example the transformers may consist of just three turns on a transformer core of 1 mm$^2$ cross section. Indeed the transformers required may readily be implemented in planar (integrated within printed circuit board) form. Thus they may be suitable for inclusion in packages normally used for integrated circuits, thus allowing integration of semiconductor and magnetic elements associated with direct drive functionality. The small size of the transformers allows for several transformers to be formed simultaneously which will now be described with reference to FIGS. 6 to 10.1. More particularly, and with reference to FIG. 6, an arrangement 100 of two pulse transformers is shown although it will be appreciated that the number of pulse transformers will depend on circuit requirements and so there may be more than two. Each of the pulse transformers comprises a magnetic core and primary and secondary windings. The primary and secondary windings are provided as conductive tracks 110, 112, 114, 116, 118, 120 on a printed circuit board 102. The tracks may be on buried layers, for example tracks 118 and 120 or on either of the top or bottom layers of the circuit board, for example tracks 110, 112, 114 and 116. The tracks on the top or bottom layers may be coated with a layer of insulating material. The tracks are suitably arranged around legs of the magnetic core. By virtue of the nature of the drive circuits described above the number of turns required for either of the primary or secondary windings is relatively small, perhaps just one or two and so the windings are easily arranged as concentric tracks around one of the legs. It will be appreciated that where a greater number of turns is required that turns may be provided on different layers within a multi-layer circuit board and connected by interconnects. Openings are formed in the circuit board to receive leg pieces 109, 111 for each of the magnetic cores. The magnetic cores are completed by top and bottom sections 106, 108, 104. In the exemplary arrangement shown, the top sections and legs are provided as a single 'C' shaped piece of magnetic material. The bottom sections of both transformers are integrally formed by virtue of being a common piece of magnetic material 104. Thus the transformers can be readily and quickly assembled by placing the bottom section in situ and then placing the legs of the respective 'C' shaped sections into the respective openings of the circuit board 102. The top and bottom sections may be held in place by adhesive or other suitable method of fixing. The openings in the circuit board for receiving the legs may be larger than required to facilitate ease of insertion. However, to ensure isolation requirements are met, a minimum distance may be required between the conductive tracks and the legs. Spacing between transformers may be determined by layout requirements for tracking on or within the printed circuit board and by the possible need for avoidance of parasitic magnetic coupling.

The use of a single piece construction is not restricted to the bottom section. Thus, for example and with reference to FIG. 7, an arrangement 130 is shown in which the top and leg sections are provided as single piece of magnetic material 132. It will be appreciated that this construction allows for the placement of multiple transformer cores in two steps, i.e. placement of bottom section and placement of top section, in contrast to FIG. 6, which allows a single step placement for the bottom section and the individual placement of the top sections. The single piece construction may be constructed from individual pieces of magnetic material for the legs which have been fixed, e.g. using an adhesive, to a single piece top section. It will be appreciated that in this context, the single piece is fabricated prior to placement on the circuit board 102. It is also preferable that both top and bottom sections do not provide continuous sections of magnetic material as flux from one transformer core may flow through to the other core.

The use of a single piece construction for multiple top and bottom sections is not restricted to using a single piece formed from magnetic material. Thus, for example and with reference to FIG. 8, an arrangement 140 is shown in which the top sections 106, 108 of respective 'C' shaped cores are provided in a common assembly frame 142. The common assembly frame may be provided in a plastics material. Whilst, the arrangement 140 includes a single piece of magnetic material 104 for the bottom sections of the transformers, it will be appreciated that a common assembly frame may also be used for the bottom section albeit that the magnetic sections in the assembly would be plates rather than 'C' shaped sections. As may be seen in the cross sectional view of one of the top sections of magnetic material, the relative size of the frame assembly may be fairly small. Thus for example the dimensions for the thickness of the leg sections for the requirements discussed above may be less than 5 mm and generally only a couple of mm and so the frame may be less than a cm in width and generally less than 5 mm wide.

The use of a single piece construction for either of the top and bottom sections may be temporary as a stage in the manufacturing process. Thus, for example and with reference to FIG. 10, an arrangement 150 is shown in which the top 'C' sections 106, 108 are integrally formed on a common substrate of magnetic material 152 allowing for ease and speed of placement onto the circuit board 102. Once assembled onto the circuit board, the commons substrate may be removed from the 'C' sections 106, 108. To facilitate this, score lines may be defined, by scribing other process, to provide a weakness between the common substrate and the 'C' sections thus allowing for the common substrate to be snapped off.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention. It will be understood that whilst particular polarity devices, e.g. PMOS, NMOS, PNP or NPN may be illustrated in the figures, that alternative polarity devices may be employed by appropriate modification of the circuits.

It will be appreciated that the present application has been described generally in the context of isolated gate drives. It will be understood that this refers to the use of a transformer to provide a drive signal to a switch. The provision of a drive signal to a switch may not be for isolation as such but may for example be for level shifting to provide a higher voltage drive signal from a low voltage control circuit.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments. Equally, whilst the claims are directed to an isolated gate drive or reset circuit for same, the application is not to be construed as being so limited and extends to a method for doing same.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. Additionally, it will be appreciated that in the claims which follow the claims are presented with multiple independent claims which are all generally directed to the provision of an isolated gate drive circuit in which pulses are employed to control the gate of a semiconductor switch. Accordingly, each of the independent claims and their associated dependent claims are to be taken to include combinations with each and all of the other independent claims and their dependencies with appropriate revisions for antecedence and claim phrasing.

The invention claimed is:

1. A gate drive circuit for controlling the operation of a first semiconductor switch having a gate, the isolated gate drive circuit comprising:
   a first transformer that transfers a first pulse from a primary side of the first transformer to a secondary side of the first transformer;
   a first rectifier for providing the transferred first pulse directly to the gate of the first semiconductor switch to cause the semiconductor switch to be turned on;
   a second semiconductor switch, which, in a first state, clamps a gate voltage of the first semiconductor switch, and, in a second state, is open;
   a reset circuit that is triggered by the arrival of the first pulse to place the second semiconductor switch in the second state upon an arrival of the first pulse, wherein the reset circuit includes a timer responsive to the arrival of the first pulse, and wherein the reset circuit is configured to turn off the semiconductor switch within a predefined interval after the arrival of the first pulse; and
   a second transformer that transfers a second pulse from a primary side of the second transformer to the secondary side of the second transformer, wherein the reset circuit is configured to turn off the first semiconductor switch in response to the arrival of the second pulse irrespective of whether the predefined interval has expired.

2. The gate drive circuit according to claim 1, wherein the timer comprises a monostable circuit having a time constant defined by a resistor-capacitor combination, said time constant defining the predefined interval.

3. The gate drive circuit according to claim 1, further comprising a second rectifier, wherein the first pulse is presented to the reset circuit through the second rectifier.

4. The gate drive circuit according to claim 1, wherein the reset circuit comprises a second switch for connecting the gate of the first semiconductor switch to a transformer winding to recover energy from the gate.

5. The gate drive circuit according to claim 4, wherein the transformer winding is a winding on the first transformer.

6. The gate drive circuit according to claim 4, wherein the second switch is in parallel with the first rectifier.

7. The gate drive circuit according to claim 4, wherein the transformer winding is a primary winding of a further transformer with a secondary winding of the further transformer directing the recovered energy into a circuit.

8. The gate drive circuit according to claim 7, wherein the circuit provides a primary side bias supply.

9. A reset circuit for an isolated gate drive circuit controlling the operation of a first semiconductor switch having a gate, wherein the isolated gate drive circuit includes a first transformer that transfers a first unipolar pulse from a primary side of the first transformer to a secondary side of the first transformer to provide a voltage through a first rectifier directly to the gate of the first semiconductor switch to cause the first semiconductor switch to be turned on, the reset circuit comprising:
   a second transformer; and
   a monostable circuit having a stable state and a metastable state, wherein the monostable circuit is configured to be triggered into the metastable state by the arrival of the first unipolar pulse, wherein the monostable circuit includes a second semiconductor switch configured to clamp a gate voltage of the first semiconductor switch when the monostable circuit is in the stable state, and wherein the monostable circuit is configured to be reset in response to the arrival of a second unipolar pulse provided through the second transformer.

10. The reset circuit according to claim 9, wherein in the metastable state of the monostable circuit, the second semiconductor switch is configured to not clamp the gate voltage of the first semiconductor switch.

11. The reset circuit according to claim 9, wherein the monostable circuit comprises a resistor-capacitor combination, a voltage in the resistor-capacitor combination effecting the operation of the second semiconductor switch.

12. The reset circuit according to claim 11, wherein the isolated gate drive circuit is operated at a switching frequency defining a switching period and where the resistor-capacitor combination has a time constant less than three times the switching period.

13. The reset circuit according to claim 9, further comprising a second rectifier, wherein the first pulse is presented to the reset circuit through the second rectifier.

14. The reset circuit according to claim 9, wherein a secondary winding of the second transformer provides a signal to a third switch to cause the discharge of the capacitor of the RC combination.

15. A gate drive circuit for operating a semiconductor switch having a gate with a gate capacitance, the gate drive circuit comprising:
   a control circuit for generating a first pulse, having a first pulse voltage and a first pulse width, and for generating a second pulse;

a first transformer having a primary winding on a primary side connected to the first pulse generator to receive the first pulse, and a secondary winding on a secondary side for providing a transformed first pulse;

a rectifier connected between the secondary winding and the gate of the semiconductor switch, wherein the first pulse voltage times a turns ratio of the transformer is selected to be less than a gate voltage required to turn on the semiconductor switch;

a series inductance-capacitance (LC) combination, having a series resonant period greater the first pulse width and less than five times the first pulse width, where the series inductance-capacitance (LC) combination is provided on the secondary side of the first transformer to enhance a voltage presented by the transformed first pulse to a level where the semiconductor is switched ON in response to the first pulse;

a reset circuit for switching off the semiconductor switch; and a second transformer having a primary side with a primary winding for receiving the second pulse and a secondary winding connected as an input to the reset circuit, wherein the reset circuit is configured to switch off the semiconductor switch in response to the second pulse.

16. The gate drive circuit according to claim 15, wherein an inductance of the series inductance-capacitance combination comprises a leakage inductance of the transformer.

17. The gate drive circuit according to claim 15, wherein the inductance of the series inductance-capacitance combination comprises a discrete inductor provided in the secondary path.

18. The gate drive circuit according to claim 15, wherein the series resonant period is approximately twice the first pulse width of the first pulse.

19. The gate drive circuit according to claim 15, wherein the series resonant period is greater than the first pulse width of the first pulse.

20. The gate drive circuit according to claim 15, wherein the series resonant period is within 30% of the first pulse width of the first pulse.

* * * * *